United States Patent [19]

Norling

[11] Patent Number: 4,879,914
[45] Date of Patent: Nov. 14, 1989

[54] UNITARY PUSH-PULL FORCE TRANSDUCER

[75] Inventor: Brian L. Norling, Mill Creek, Wash.

[73] Assignee: Sundstrand Data Control, Inc., Redmond, Wash.

[21] Appl. No.: 316,341

[22] Filed: Feb. 27, 1989

[51] Int. Cl.[4] .......................... G01L 1/10; G01P 15/10; G01B 17/04
[52] U.S. Cl. ............................ 73/862.59; 73/517 AV; 73/778
[58] Field of Search ............. 73/862.59, 517 AV, 777, 73/778, DIG. 1

[56] References Cited

U.S. PATENT DOCUMENTS

| | | |
|---|---|---|
| 4,215,570 | 8/1980 | Eer Nisse . |
| 4,221,131 | 9/1980 | Albert . |
| 4,372,173 | 2/1983 | Eer Nisse et al. . |
| 4,467,651 | 8/1984 | Peters et al. . |
| 4,587,853 | 5/1986 | Komoto et al. ................. 73/862.59 |
| 4,718,275 | 1/1988 | Norling . |
| 4,766,768 | 8/1988 | Norling et al. ............. 73/517 AV X |
| 4,785,215 | 11/1988 | Blech ........................... 73/862.59 X |

FOREIGN PATENT DOCUMENTS 559136  5/1977  U.S.S.R. ......................... 73/DIG. 1

Primary Examiner—Charles A. Ruehl
Attorney, Agent, or Firm—Michael S. Yatsko; Trevor B. Joike

[57] ABSTRACT

A push-pull force transducer comprising a unitary body formed from a crystalline substrate. The body comprises first and second mounting elements for mounting the force transducer to first and second structures, and first and second force sensing elements connected to the mounting elements. Each force sensing element has first and second ends, a line extending from the second to the first end defining a force sensing axis for the force sensing elements. The force sensing elements are oriented with their force sensing axes parallel to and aligned with one another. The first force sensing element has its first end connected to the second mounting element and its second end connected to the first mounting element. The second force sensing element has its first end connected to the first mounting element and its second end connected to the second mounting element. Also described are embodiments utilizing strain relief flexures and an embodiment featuring a leveraged design.

10 Claims, 3 Drawing Sheets

U.S. Patent  Nov. 14, 1989  Sheet 1 of 3  4,879,914
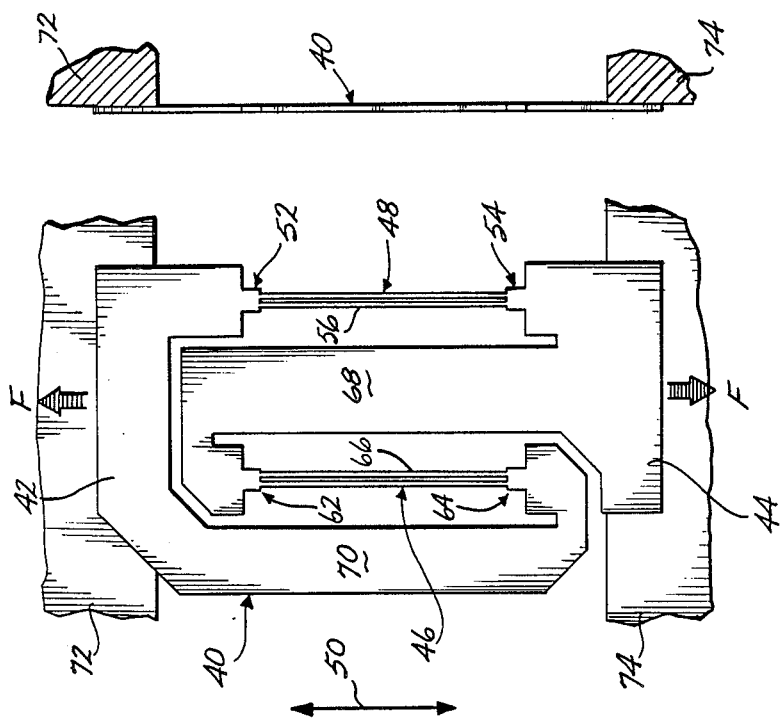
Fig. 3.
Fig. 2.
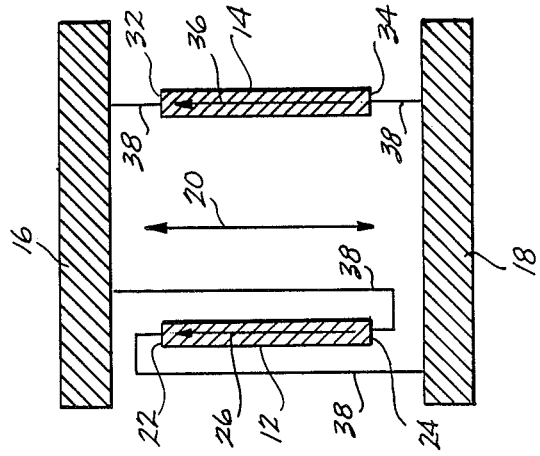
Fig. 1.

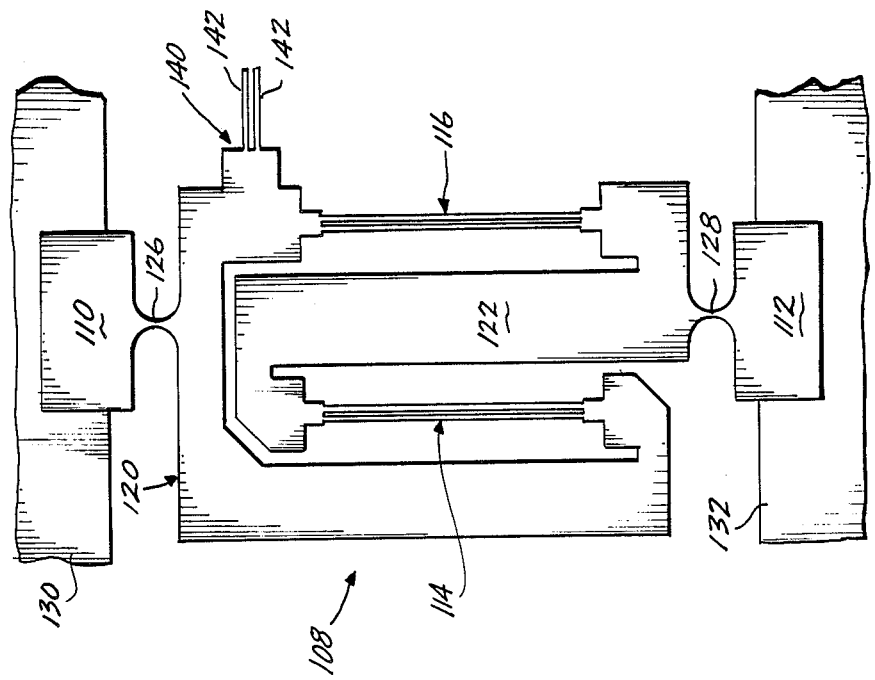
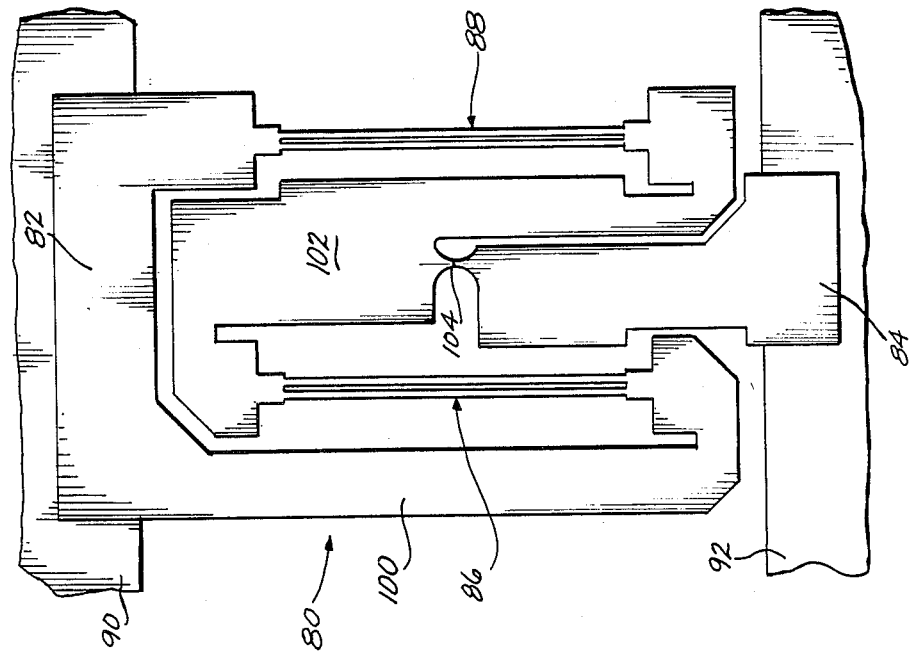

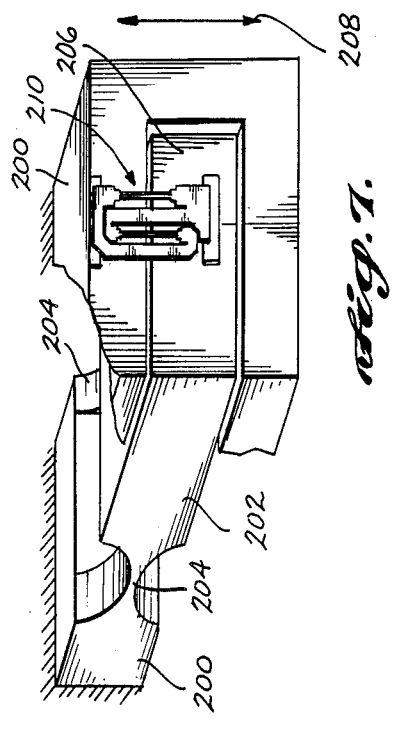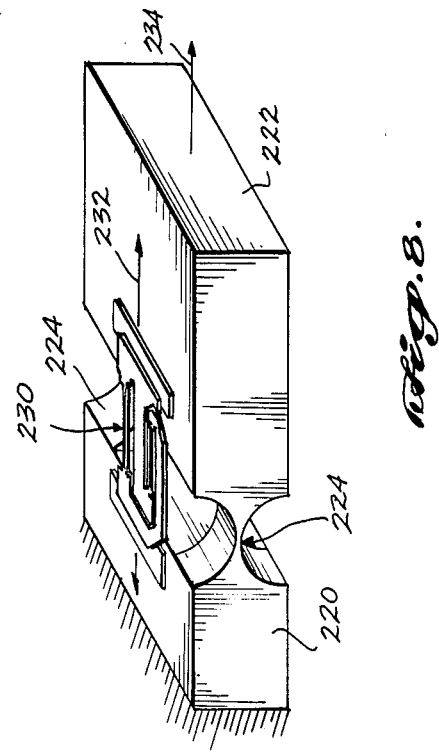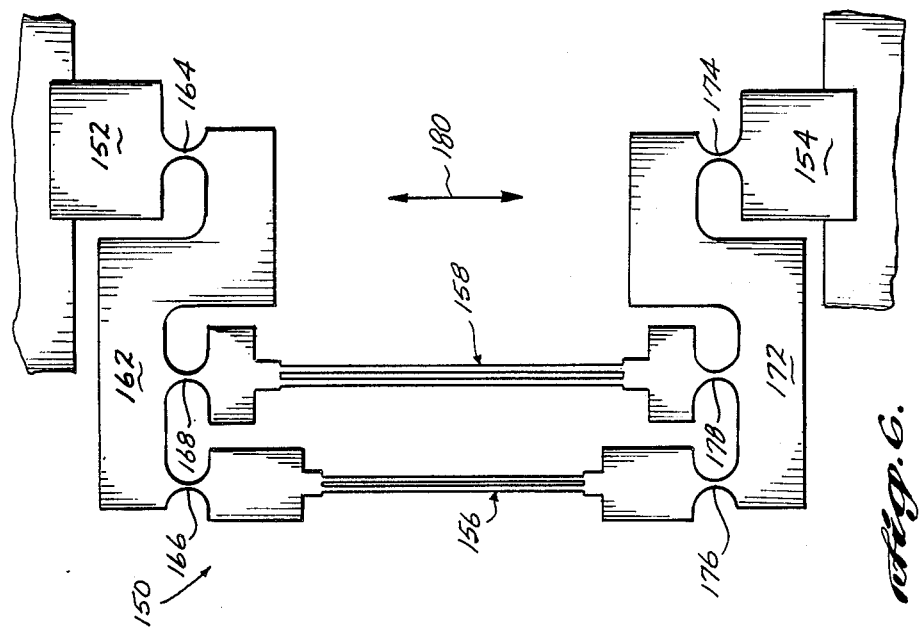

UNITARY PUSH-PULL FORCE TRANSDUCER

FIELD OF THE INVENTION

The present invention relates to force transducers and, in particular, to force transducers that include two force sensing elements arranged in a push-pull configuration.

BACKGROUND OF THE INVENTION

A common method of reducing errors in force transducer systems is to use a push-pull arrangement in which two well matched force sensing elements are configured such that they are subjected to forces in opposite directions. The purpose of this arrangement is to cancel common mode errors, such as even order nonlinearities, bias temperature sensitivity, clock sensitivity, bias aging drift, and pressure sensitivity.

Problems arise when a push-pull arrangement is implemented in a physical device. For example, to utilize push-pull force sensing elements in a pendulous accelerometer, two force sensing elements are both connected to a common proof mass. The force sensing elements typically extend either perpendicular to or parallel to the pendulous axis of the accelerometer. However in such a configuration, any thermal expansion mismatch between the support/proof mass assembly and the force sensing elements creates thermal strains that in turn create large common mode error signals that can only be partially suppressed by signal processing techniques. As a result, the force sensing elements should be physically matched in all sensitivities, in order to provide a high level of common mode rejection. This close matching is often difficult to achieve.

SUMMARY OF THE INVENTION

The present invention provides a push-pull force transducer fabricated as a unitary structure. The transducer may be connected, for example, between the proof mass and the support of an accelerometer, to provide a sensor having improved rejection of common mode errors.

In a first preferred embodiment, the force transducer comprises a unitary body formed from a crystalline substrate. The unitary body comprises first and second mounting elements for mounting the force transducer to first and second structures, and first and second force sensing elements connected to the mounting elements. Each force sensing element has first and second ends, a line extending from the second end to the first end defining a force sensing axis for the force sensing element. Each force sensing element is sensitive to a force exerted in either direction along its force sensing axis. The force sensing elements are oriented with their force sensing axis parallel to and aligned with one another. Coupling means connects each force sensing element to both mounting elements. The first force sensing element has its first end connected to the second mounting element and its second end connected to the first mounting element. The second force sensing element has its first end connected to the first mounting element and its second end connected to the second mounting element. Thus a force exerted on the force transducer by these structures parallel to the force sensing axes results in a compression force on one force sensing element and a tension force on the other force sensing element. In further embodiments, flexures are used to provide a strain relief within the unitary body, and a portion of the body is formed so as to produce a leveraging effect that results in push-pull operation.

BRIEF DESCRIPTION OF THE DRAWINGS

FIG. 1 is a schematic diagram illustrating the operation of the invention;

FIG. 2 is a top plan view showing a first preferred embodiment of the force transducer;

FIG. 3 is a side elevational view of the force transducer of FIG. 2;

FIG. 4 is a top plan view of a second embodiment of the force transducer;

FIG. 5 is a top plan view of a third embodiment of the force transducer;

FIG. 6 is a top plan view of a fourth embodiment of the force transducer; and

FIGS. 7 and 8 are perspective views showing the force transducer in use in an accelerometer.

DETAILED DESCRIPTION OF THE INVENTION

FIG. 1 presents a schematic view of the force transducer of the present invention. The force transducer comprises force sensing elements 12 and 14 connected between mounting elements 16 and 18. The mounting elements are used to mount the force transducer to the appropriate structures in a sensor. For example in an accelerometer, mounting element 16 could be connected to a support, and mounting element 18 could be connected to a pendulously mounted proof mass. These structures apply a tension or compression force on the force transducer along transducer axis 20. The transducer senses this force, and thereby provides a measure of the acceleration of other quantity of interest.

Force sensing element 12 includes first end 22 and second end 24, a line extending from second end 24 to first end 22 defining a first force sensing axis 26. Force sensing element 14 similarly includes first end 32 and second end 34, a line extending from second end 34 to first end 32 defining a second force sensing axis 36. The force sensing axes are parallel to one another, and to transducer axis 20. For both force sensing elements, their first ends are defined to be those that lie closer to mounting element 16, and their second ends are defined to be those that lie closer to mounting element 18. Thus force sensing axes 26 and 36 are aligned with one another, in the sense that they point in the same direction (upward in FIG. 1) along transducer axis 20.

With the above nomenclature, the present invention can be described as one in which coupling means 38 interconnect the mounting and force sensing elements, such that force sensing element 12 has its first end 22 connected to mounting element 18 and its second end 24 connected to mounting element 16, and such that force sensing element 14 has its first end 32 connected to mounting element 16 and its second end 34 connected to mounting element 18. A force exerted on mounting element 16 is therefore coupled to second end 24 of force sensing element 12, and to first end 32 of force sensing element 14. Similarly, a force exerted on mounting element 18 is coupled to first end 22 of force sensing element 12, and to second end 34 of force sensing element 14. As a result of this coupling scheme, any force (either tension or compression) exerted between mounting elements 16 and 18 along force sensing axis 20 produces a compression force on one force sensing element, and a tension force on the other force sensing element.

A preferred embodiment of the force transducer of the present invention is illustrated in FIGS. 2 and 3. The transducer includes body 40 shaped so as to form mounting elements 42 and 44 and force sensing elements 46 and 48, in an arrangement similar to that shown in FIG. 1. The transducers are illustrated as being of the dual vibrating beam type, although other types of force transducers, such as surface acoustic wave transducers, single vibrating beam transducers and piezoresistive strain gauges could also be used. Force sensing element 48 has a first end 52 connected to mounting element 42, a second end 54 connected to mounting element 44, and a pair of beams 56 extending between ends 52 and 54. Force sensing element 46 has a first end 62, a second end 64, and a pair of beams 66 connected between ends 62 and 64. The force sensing axis of each force sensing element lies along its respective beams, which beams are parallel to transducer axis 50.

First end 62 is connected to arm 68 that extends from mounting element 44 towards mounting element 42 along transducer axis 50. In a similar manner, second end 64 of force sensing element 46 is connected to arm 70 that extends from mounting element 42 towards mounting element 44 along transducer axis 50. Mounting elements 42 and 44 are attached to structures 72 and 74 respectively, such that the force transducer provides a measurement of the tension or compression force coupled thereto by these structures. Arm 68 that extends between force sensing elements 46 and 48 provides isolation between the force sensing elements and thereby helps to prevent a lock in condition from occurring.

Force transducer body 40 is a unitary structure rather than an assembly of initially separate parts. For example, body 40 may be formed by etching a substrate comprising a crystalline quartz or silicon wafer. An important advantage of forming the body in this manner is that force transducers 46 and 48 will be formed from closely spaced positions in a common underlying material, producing a pair of force sensing elements having closely matched sensitivities. The close matching of sensitivities will provide good common mode rejection of errors when conventional means are used for combining the force sensing element outputs.

A second preferred embodiment of the invention is illustrated in FIG. 4. This embodiment is generally similar to the embodiment shown in FIG. 2, and includes unitary body 80 shaped so as to form mounting elements 82 and 84 and force sensing elements 86 and 88. Mounting elements 82 and 84 are attached to underlying structural elements 90 and 92, respectively. In this embodiment, the mounting and force sensing elements are interconnected by arm 100 that extends from mounting element 82, and by bridge section 102 that is connected to mounting element 84 by flexure 104. Bridge section 102 is secured to opposite ends of force transducers 86 and 88. Flexure 104 permits bridge section 102 to rotate with respect to mounting element 84, about a strain relief axis passing through the flexure normal to a plane containing the force sensing elements. Thus the embodiment of FIG. 4 permits a certain amount of rotation to occur between structural elements 90 and 92, without affecting the force measurement. As with the embodiment of FIGS. 2-3, the unitary structure of the FIG. 4 embodiment enhances common mode error rejection.

A third preferred embodiment of the invention is shown in FIG. 5. This embodiment comprises unitary body 108 that includes mounting elements 110 and 112 and force sensing elements 114 and 116 connected between the mounting elements. Mounting elements 110 and 112 are connected to bridge sections 120 and 122 by flexures 126 and 128, respectively. Each bridge section is connected to opposite ends of force sensing elements 114 and 116. Mounting elements 110 and 112 mount the transducer to structures 130 and 132, respectively. Flexures 126 and 128 both permit relative rotation between the corresponding mounting elements and bridge sections about strain relief axes normal to the plane of body 108, and thus provide an additional degree of insensitivity to rotations of structures 130 and 132 in that plane.

FIG. 5 also illustrates temperature sensor 1450 that may be provided as part of either bridge section or mounting element, for an embodiment in which the force transducer is fabricated from crystalline quartz. The illustrated integral quartz tuning fork temperature sensor comprises a pair of mutually parallel beams 142 that are oriented perpendicular to the beams of force sensing elements 114 and 116, in the plane defined by the force sensing elements. This orientation provides a structure that is compatible with the crystallographic axis orientation necessary for both the force transducers and temperature sensor to function. This arrangement has the advantage of placing all sensor elements on one unitary structure, for ease of installation and wiring.

A fourth preferred embodiment of the invention is illustrated in FIG. 6. As in prior embodiments, the embodiment of FIG. 6 includes a unitary body 150 shaped to form mounting elements 152 and 154, and force sensing elements 156 and 158. However, the principle of operation of the FIG. 6 embodiment differs from those described above. Mounting element 152 is coupled to the upper ends of the force sensing elements by bridge section 162, and mounting element 154 is coupled to the lower ends of the force sensing elements by bridge section 172. Bridge section 162 is connected to mounting element 152 by flexure 164, and to force sensing elements 156 and 158 by flexures 166 and 168, respectively. In a similar manner, bridge section 172 is connected to mounting element 154 by flexure 174, and to force sensing elements 156 and 158 by flexures 176 and 178, respectively. All illustrated flexures provide rotational compliance about strain relief axes that pass through the respective flexures and that are normal to the plane in which body 150 is formed.

The embodiment of FIG. 6 measures force along transducer axis 180 that is parallel to both force sensing elements. The transducer utilizes a lever arm technique to load one force sensing element in tension, and the other in compression. Mechanical advantage is achieved by adjusting the ratio of distances between the flexures, in the direction normal to transducer axis 180 in the plane of body 150. Force sensing element 158 will always be loaded to a greater extent than force sensing element 156. This may be used to advantage, to permit the use of relatively large and relatively small force sensing elements, operating at separate frequencies, but with cancelling nonlinearities. The operation of the force sensing elements at different frequencies eliminates the potential for lock in between the elements.

FIG. 7 illustrates the use of the push-pull force transducer of the present invention in a pendulous accelerometer. The accelerometer comprises support 200 from which proof mass 202 is suspended by flexures 204. The flexures permit outer end 206 of proof mass 202 to move along input axis 208. Force transducer 210 of the present invention may be connected between outer end 206 and the adjacent area of support 200, such that the transducer axis is aligned with input axis 208.

FIG. 8 shows a second application of the force transducer in a pendulous accelerometer. The accelerometer comprises support 220 from which proof mass 222 is suspended by flexures 224. Force transducer 230 of the present invention is connected between the proof mass and support, such that transducer axis 232 is parallel to, or substantially parallel to, pendulous axis 234 of proof mass 222. In the accelerometers illustrated in FIGS. 7 and 8, differential thermal expansion of the force transducer, with respect to the other accelerometer components, will cause a slight rotation of the proof mass, producing a small error term that can be substantially eliminated by conventional signal processing techniques for a push-pull force transducer.

While the preferred embodiments of the invention have been described, variations will be apparent to those skilled in the art. Accordingly, the scope of the invention is to be determined by reference to the following claims.

The embodiments of the invention in which an exclusive property or privilege is claimed are defined as follows:

1. A force transducer capable of being attached between first and second structures, the force transducer comprising a unitary body formed from a crystalline substrate, the unitary body comprising:
   first and second mounting elements for mounting the force transducer to the first and second structures, respectively;
   first and second force sensing elements, each force sensing element having first and second ends, a line extending from the second end to the first end of each force sensing element defining a force sensing axis for the force sensing element, each force sensing element being sensitive to a force exerted in either direction along its force sensing axis, the force sensing elements being oriented with their force sensing axes parallel to and aligned with one another; and
   coupling means for interconnecting the mounting elements and force sensing elements such that the first force sensing element has its first end connected to the second mounting element and its second end connected to the first mounting element, and such that the second force sensing element has its first end connected to the first mounting element and its second end connected to the second mounting element, whereby a force exerted on the force transducer by the structures parallel to the force sensing axes results in a compression force on one force sensing element and a tension force on the other force sensing element.

2. The force transducer of claim 1, wherein the coupling means comprises a bridge member connected to the first end of one of the force sensing elements and to the second end of the other force sensing element, and further connected to one of the mounting elements by flexure means, the flexure means permitting rotation of the bridge member with respect to said one mounting element around a strain relief axis normal to plane containing the force sensing axes.

3. The force transducer of claim 1, wherein the coupling means comprises first and second bridge members, the first bridge member being connected to the second end of the first force sensing element and to the first end of the second force sensing element and further being connected to the first mounting element by first flexure means, the second bridge member being connected to the first end of the first force sensing element and to the second end of the second force sensing element, and further being connected to the second mounting element by second flexure means, each flexure means permitting rotation of the respective bridge member with respect to the respective mounting element about a strain relief axis normal to a plane containing the force sensing axes.

4. The force transducer of claim 1, wherein the crystalline substrate comprises crystalline quartz.

5. The force transducer of claim 4, wherein each force sensing element comprises a dual vibrating beam force transducer.

6. The force transducer of claim 4, wherein the unitary body comprises a tuning fork temperature sensor.

7. The force transducer of claim 1, wherein the crystalline substrate comprises silicon.

8. The force transducer of claim 7, wherein each force sensing element comprises a dual vibrating beam force sensing element.

9. The force transducer of claim 1, wherein a portion of the coupling means extends between the force sensing elements.

10. A force transducer capable of being attached between first and second structures for measuring a force exerted on the force transducer by the first and second structures, the force transducer comprising a unitary body formed from a crystalline substrate, the unitary body comprising:
   first and second mounting elements for mounting the force transducer to the first and second structures, respectively;
   first and second force sensing elements, each force sensing element having first and second ends, a line extending from the second end to the first end of each force sensing element defining a force sensing axis for the force sensing element, each force sensing element being sensitive to a force exerted in either direction along its force sensing axis, the force sensing elements being oriented with their force sensing axis parallel to and aligned with one another; and
   coupling means for interconnecting the mounting elements and force sensing elements, the coupling means comprising a first bridge member, first flexure means for connecting the first bridge member to the first mounting element, and second and third flexure means for connecting the first bridge member to the first ends of the first and second force sensing elements, respectively, a second bridge member, fourth flexure means for connecting the second bridge member to the second mounting element, fifth and sixth flexure means for connecting the second bridge member to the second ends of the first and second force sensing elements, respectively, all flexures permitting rotation of components to which they are attached about strain relief axes normal to a plane containing the force sensing axes, the flexures to which each bridge member is attached being spaced from one another along a transverse direction in said plane and normal to the force sensing axes, the second flexure being positioned between the first and third flexures along said transverse direction, the first flexure being positioned between the fourth and sixth flexures along said transverse direction, whereby a given force exerted on the mounting elements by the first and second structures causes the first and second bridge sections to pivot in opposite directions about the second and fifth flexures, respectively, producing a compression force on one force sensing element and a tension force on the other force sensing element.

* * * * *